United States Patent
Kai et al.

(10) Patent No.: US 8,461,932 B2
(45) Date of Patent: Jun. 11, 2013

(54) SIGNAL AMPLIFIER, BRIDGE CONNECTION SIGNAL AMPLIFIER SIGNAL OUTPUT DEVICE, LATCH-UP PREVENTION METHOD, AND PROGRAM STORAGE MEDIUM

(75) Inventors: Atsuhiro Kai, Miyazaki (JP); Osamu Kukori, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 12 days.

(21) Appl. No.: 13/240,131

(22) Filed: Sep. 22, 2011

(65) Prior Publication Data

US 2012/0068764 A1    Mar. 22, 2012

(30) Foreign Application Priority Data

Sep. 22, 2010   (JP) ................................. 2010-212594

(51) Int. Cl.
*H03F 1/52* (2006.01)
(52) U.S. Cl.
USPC ........................................................ 330/298
(58) Field of Classification Search
USPC ............................................ 330/207 P, 298
See application file for complete search history.

(56) References Cited

U.S. PATENT DOCUMENTS 4,322,770 A * 3/1982 Sendelweck ................. 361/91.5
7,570,118 B1 * 8/2009 Gaboriau et al. .............. 330/298

FOREIGN PATENT DOCUMENTS

JP      2000-174565      6/2000

* cited by examiner

*Primary Examiner* — Steven J Mottola
(74) *Attorney, Agent, or Firm* — Volentine & Whitt, PLLC (57) ABSTRACT

A signal amplifier includes an inverting amplification circuit, a first switching element, a second switching element, and a control section. The inverting amplification circuit includes a first voltage terminal, a second voltage terminal, an inverting input terminal, an output terminal, a first protected switching element, and a second protected switching element. The control section controls such that when an overcurrent has flowed in the first voltage line, the first and second protected switching elements are switched to a non-conducting state after switching the first switching element in a conducting state and switching the second switching element in a non-conducting state, and when an overcurrent has flowed in the second voltage line, the first the second protected switching elements are switched to a non-conducting state after switching the first switching element in a non-conducting state and switching the second switching element in a conducting state.

8 Claims, 5 Drawing Sheets

SIGNAL AMPLIFIER, BRIDGE CONNECTION SIGNAL AMPLIFIER SIGNAL OUTPUT DEVICE, LATCH-UP PREVENTION METHOD, AND PROGRAM STORAGE MEDIUM

CROSS-REFERENCE TO RELATED APPLICATION

This application is based on and claims priority under 35 USC 119 from Japanese Patent Application No. 2010-212594 filed on Sep. 22, 2010, the disclosure of which is incorporated by reference herein.

BACKGROUND

1. Technical Field

The present invention relates to a signal amplifier, a bridge connection signal amplifier, a signal output device, a latch-up prevention method, and a program storage medium storing a latch-up prevention program.

2. Related Art

Figure 5:
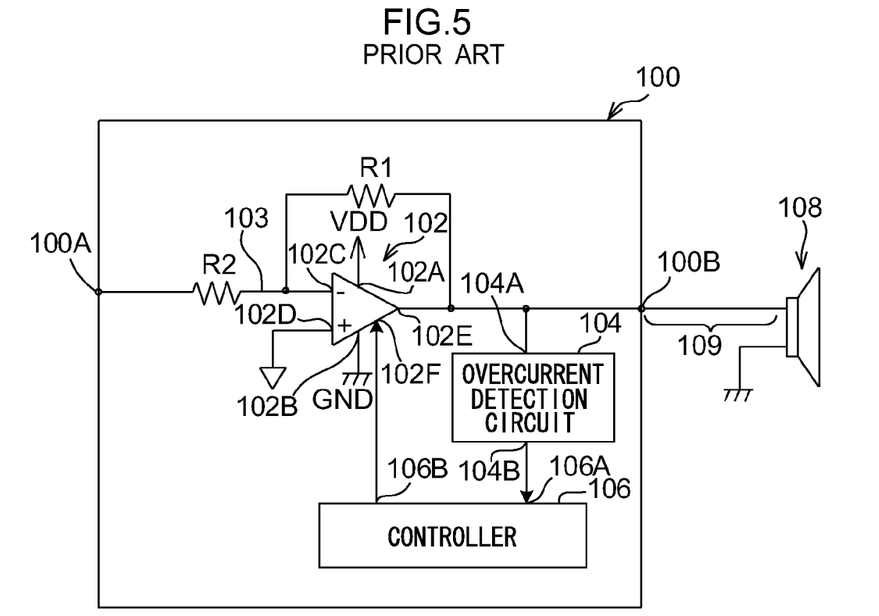
FIG. 5 is a configuration diagram showing an example of a configuration of a conventional amplifier.

FIG. 5 shows an example of a conventional amplifier 100 used for connecting to a speaker. As shown in FIG. 5, the amplifier 100 is configured including an inverting amplification circuit 102, an overcurrent detection circuit 104 and a controller 106. The inverting amplification circuit 102 includes a power supply terminal 102A serving as a first voltage terminal connected to a power supply line VDD applied with a positive driving voltage, a ground terminal 102B serving as a second voltage terminal connected to a ground line GND applied with ground voltage, an inverting input terminal 102C to which a signal line 103 is connected, a non-inverting input terminal 102D to which a reference voltage (ground voltage in this example) is applied, an output terminal 102E, and a control terminal 102F. A resistance element R2 is provided at the signal line 103, and the inverting input terminal 102C is connected through the resistance element R2 to an input terminal 100A of the amplifier 100. The output terminal 102E is connected to the inverting input terminal 102C though a resistance element R1, and is also connected to the positive input terminal of a speaker 108 through a cable 109 leading from an output terminal 100B of the amplifier 100. The negative input terminal of the speaker 108 is grounded.

The overcurrent detection circuit 104 includes an input terminal 104A and an output terminal 104B. The input terminal 104A is connected to the output terminal 102E, and the overcurrent detection circuit 104 detects overcurrent when overcurrent has been input from the inverting amplification circuit 102, and outputs an overcurrent detection signal from the output terminal 104B. In the following explanation, situations in which power is introduced to the amplifier 100 and no overcurrent is generated are referred to as a "normal operation".

The controller 106 is a computer including a central processing unit (CPU) that controls the amplifier 100 overall by executing processing of a specific program, a read only memory (ROM) that is a storage medium pre-stored with a control program for controlling operation of the amplifier 100 and with various parameters, and a random access memory (RAM) that is a storage medium employed for example as a work area used during execution of the various programs.

The controller 106 includes an input terminal 106A and an output terminal 106B. The input terminal 106A is connected to the output terminal 104B of the overcurrent detection circuit 104, and the output terminal 106B is connected to a control terminal 102F of the inverting amplification circuit 102.

Figure 6:
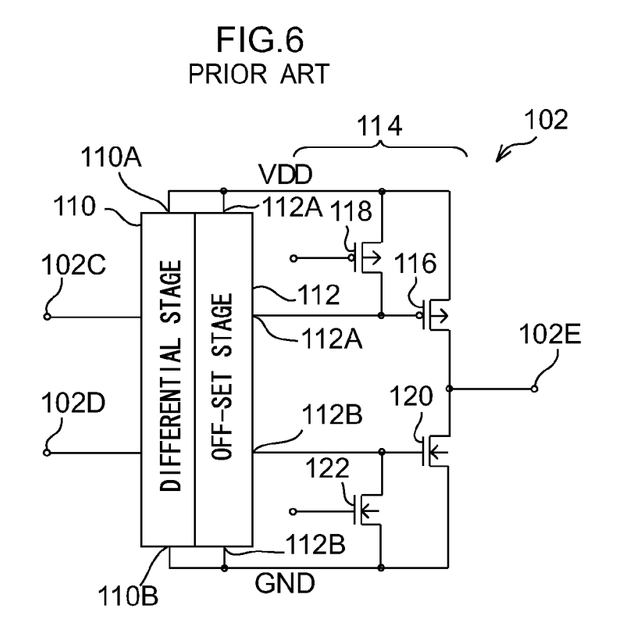
FIG. 6 a configuration diagram showing an example of a configuration of an inverting amplification circuit of the conventional amplifier.

FIG. 6 is a diagram showing main configuration of the inverting amplification circuit 102. As shown in FIG. 6, the inverting amplification circuit 102 includes a differential stage 110, an off-set stage 112, and an output stage 114. The differential stage 110 includes a power supply terminal 110A connected to the power supply line VDD through the power supply terminal 102A shown in FIG. 5, and a ground terminal 110B connected to the ground line GND through the ground terminal 102B shown in FIG. 5, the inverting input terminal 102C, and the non-inverting input terminal 102D. The inverting amplification circuit 102 generates and outputs to the following stage of the off-set stage 112 a differential signal indicating the potential difference between the signal input to the inverting input terminal 102C and the signal input to the non-inverting input terminal 102D.

The off-set stage 112 includes a power supply terminal 112A connected to the power supply line VDD through the power supply terminal 102A shown in FIG. 5, a ground terminal 112B connected to the ground line GND through the ground terminal 102B shown in FIG. 5, and is connected to the differential stage 110 so as to receive the differential signal. The off-set stage 112 generates a differential signal of the input differential signal from which an off-set voltage component occurring in the inverting amplification circuit 102 has been removed. The off-set stage 112 is equipped with an output terminal 112A that is a negative output terminal when in normal operation and outputs a positive differential signal obtained by removing the off-set voltage component from the input differential signal, and an output terminal 112B that is a positive output terminal when in normal operation and outputs a negative differential signal obtained by removing the off-set voltage component from the input differential signal.

The output stage 114 includes the output terminal 102E, P channel MOS field effect transistors (referred to below as PMOS transistors) 116, 118 and N channel MOS field effect transistors (referred to below as NMOS transistors) 120, 122.

The PMOS transistor 116 is a first switching element to be protected (protected first switching element), and is equipped with a gate terminal connected to the output terminal 112A, a drain terminal connected to the output terminal 102E, and a source terminal connected to the power supply line VDD through the power supply terminal 102A. The PMOS transistor 116 is configured such that when a voltage of the magnitude of the power supply voltage or greater has been applied to the gate terminal, the conducting state between the source terminal and the drain terminal in normal operation changes to a non-conducting state.

The PMOS transistor 118 is a switching element for changing the conducting state between the source terminal and the drain terminal of the PMOS transistor 116 to the non-conducting state when an overcurrent has been detected by the overcurrent detection circuit 104. The PMOS transistor 118 is equipped with a source terminal connected to the power supply line VDD through the power supply terminal 102A, a drain terminal connected to the gate terminal of the PMOS transistor 116, and a gate terminal connected to the output terminal 106B of the controller 106 through the control terminal 102F.

The NMOS transistor 120 is a second switching element to be protected (protected second switching element), and is equipped with a gate terminal connected to the ground terminal 112B, a drain terminal connected to the output terminal 102E, and a source terminal connected to ground line GND through the ground terminal 102B. The NMOS transistor 120 is configured such that the conducting state between the source terminal and the drain terminal of the NMOS transistor 120 in the normal operation changes to a non-conducting state when a voltage of the magnitude of the ground voltage or lower has been applied to the gate terminal.

The NMOS transistor 122 is a switching element for changing the conducting state between the source terminal and the drain terminal of the NMOS transistor 120 to the non-conducting state when an overcurrent has been detected by the overcurrent detection circuit 104. The NMOS transistor 122 is equipped with a source terminal connected ground line GND through the ground terminal 102B, a drain terminal connected to the gate terminal of the NMOS transistor 122, and a gate terminal connected to the output terminal 106B of the controller 106 through the control terminal 102F.

When an overcurrent has been output from the inverting amplification circuit 102 in the amplifier 100 configured as described above, the overcurrent is detected by the overcurrent detection circuit 104 and an overcurrent detection signal is output to the controller 106. The amplifier is thereby powered down (driving of the amplifier is halted) and damage due to the overcurrent to the PMOS transistor 116 or the NMOS transistor 120 is prevented (see for example the Japanese Patent Application Laid-Open (JP-A) No. 2000-174565).

However, in the amplifier 100 configured as described above, when the inductance component of the equipment connected to the output terminal 100B (in FIG. 5 this refers to the parasitic inductance component of the cable 109) is a specific magnitude or greater and overcurrent flowing in the inverting amplification circuit 102 is instantly interrupted (powered down), a surge current caused by an electromagnetic inductance effect due to the interruption occurs. This surge current sometimes causes the PMOS transistor 116 and the NMOS transistor 120 to latch-up, resulting in damage to the PMOS transistor 116 and the NMOS transistor 120. Namely, a minus surge current (overcurrent in the power supply line VDD) may occur when the power supply line VDD has been shorted to the ground side, or a plus surge current (overcurrent in the ground line GND) may occur when the ground line GND has been shorted to the power supply side, both thereby causing the PMOS transistor 116 and the NMOS transistor 120 to latch-up, and causing damage to the PMOS transistor 116 and the NMOS transistor 120.

SUMMARY

In consideration of the above circumstances, the present invention provides a signal amplifier, a bridge connection signal amplifier, a signal output device, a latch-up prevention method, and a storage medium storing program capable of preventing latch-up.

A first aspect of the present invention is a signal amplifier including an inverting amplification circuit, a first conducting switching element, a second conducting switching element, and a control section. The inverting amplification circuit includes a first voltage terminal connected to a first voltage line that is applied with a first voltage, a second voltage terminal connected to a second voltage line that is applied with a second voltage that is different from the first voltage, an inverting input terminal connected to a signal line into which a signal is input, an output terminal connected via a resistance element to the inverting input terminal and connected to an inductance section having an inductor component, a first protected switching element disposed between the first voltage line and the output terminal, which switches a conducting state between the first voltage line and the output terminal during normal operation to a non-conducting state, and a second protected switching element disposed between the second voltage line and the output terminal, which switches a conducting state between the second voltage line and the output terminal during normal operation to a non-conducting state. The first conducting switching element includes a first terminal connected to the first voltage line, a second terminal connected to the signal line, and a first control terminal, the first conducting switching element switching a non-conducting state between the first terminal and the second terminal during normal operation to a conducting state when an ON voltage is applied to the first control terminal. The second conducting switching element includes a third terminal connected to the second voltage line, a fourth terminal connected to the signal line, and a second control terminal, the second conducting switching element switching a non-conducting state between the third terminal and the fourth terminal during normal operation to a conducting state when an ON voltage is applied to the second control terminal. The control section effects control such that when an overcurrent flows in the first voltage line, the first protected switching element and the second protected switching element are switched to a non-conducting state after switching the first conducting switching element to a conducting state and switching the second conducting switching element to a non-conducting state, and effects control such that when an overcurrent flows in the second voltage line, the first protected switching element and the second protected switching element are switched to a non-conducting state after switching the first conducting switching element to a non-conducting state and switching the second conducting switching element to a conducting state.

According to the present aspect, the signal amplifier is controlled such that when an overcurrent has flowed in the first voltage line, the protected first switching element and the second protected switching element are placed in a non-conducting state after placing the first switching element in a conducting state and placing the second switching element in a non-conducting state. When an overcurrent has flowed in the second voltage line, the first protected switching element and the second protected switching element are placed in a non-conducting state after placing the first switching element in a non-conducting state and placing the second switching element in a conducting state. Latch-up of the first protected switching element and the protected second switching element can accordingly be prevented.

The above aspect may be configured such that the control section effects control such that when an overcurrent flows in the first voltage line, the first protected switching element and the second protected switching element are switched to a non-conducting state at a time estimated in advance as a time for the output terminal to return to its normal operation voltage value after switching the first conducting switching element to the conducting state and switching the second switching element to the non-conducting state, and effects control such that when an overcurrent flows in the second voltage line, the first protected switching element and the second protected switching element are switched to the non-conducting state at the time estimated in advance after switching the first conducting switching element to the non-conducting state and switching the second conducting switching element to the conducting state.

A second aspect of the present invention is a bridge connection signal amplifier including: a pair of the signal amplifiers according to the first aspect; an output line connected to the output terminal of the inverting amplification circuit of a first signal amplifier of the pair of signal amplifiers, and connected to the inverting input terminal of the inverting amplification circuit of a second signal amplifier of the pair of signal amplifiers as the signal line connected to the inverting amplification circuit; and a third switching element that is provided on the output line and is in a conducting state during normal operation, the third switching element being capable of switching a conducting state between the output terminal of the first signal amplifier and the inverting input terminal of the second signal amplifier to a non-conducting state, wherein, the control sections effect control such that when an overcurrent flows in the first voltage lines, the first protected switching elements and the second protected switching elements are switched to a non-conducting state after switching the third switching element to a non-conducting state and after switching the first conducting switching elements to a conducting state and switching the second conducting switching elements to a non-conducting state in each of the pair of signal amplifiers, and effect control such that when an overcurrent flows in the second voltage lines, the first protected switching elements and the second protected switching elements are switched to a non-conducting state after switching the third switching element to a non-conducting state and after switching the first conducting switching element to a non-conducting state and switching the second conducting switching element to a conducting state in each of the pair of signal amplifiers.

Accordingly to the present aspect, the bridge connection signal amplifier is controlled such that when an overcurrent has flowed in the first voltage line, the protected first switching element and the protected second switching element are placed in a non-conducting state after placing the third switching element in a non-conducting state and, after placing the first switching element in a conducting state and placing the second switching element in a non-conducting state in each of the pair of signal amplifiers. However, when an overcurrent has flowed in the second voltage line, the bridge connection signal amplifier is controlled such that the protected first switching element and the protected second switching element are placed in a non-conducting state after placing the third switching element in a non-conducting state, and after placing the first switching element in a non-conducting state and placing the second switching element in a conducting state in each of the pair of signal amplifiers. Hence, latch-up of the protected first switching element and the protected second switching element can be prevented in each of the pair of signal amplifiers.

A third aspect of the present invention is a signal output device including: the bridge connection signal amplifier according to the second aspect; and a signal output section that outputs an amplified signal, obtained by amplifying the signal input to the signal line using the inverting amplification circuit in each of the pair of signal amplifiers, from the output terminals of each of the inverting amplification circuits via the inductance section.

A fourth aspect of the present invention is a method for preventing latch-up of a signal amplifier including the inverting amplification circuit, the first switching element and the second switching element of the first aspect. The latch-up prevention method includes: switching the first protected switching element and the second protected switching element to a non-conducting state after switching the first conducting switching element to a conducting state and switching the second conducting switching element to a non-conducting state when an overcurrent flows in the first voltage line, and switching the first protected switching element and the second protected switching element to a non-conducting state after switching the first conducting switching element to a non-conducting state and the second conducting switching element to a conducting state when an overcurrent flows in the second voltage line.

The present aspect operates similarly to that of the signal amplifier of the first aspect, so similar effects can be obtained.

A fifth aspect of the present invention is a method for preventing latch-up of a bridge connection signal amplifier of the second aspect. The latch-up prevention method includes: switching the first protected switching element and the second protected switching element to a non-conducting state after switching the third switching element to a non-conducting state, and after switching the first conducting switching element to a conducting state and switching the second conducting switching element to a non-conducting state in each of the pair of signal amplifiers when an overcurrent flows in the first voltage line; and switching the first protected switching element and the second protected switching element to a non-conducting state after switching the third switching element to a non-conducting state, and after switching the first conducting switching element to a non-conducting state and switching the second conducting switching element to a conducting state in each of the pair of signal amplifiers when an overcurrent flows in the second voltage line.

The present aspect operates similarly to that of the bridge connection signal amplifier of the second aspect, so similar effects can be obtained.

A sixth aspect of the present invention is a non-transitory computer readable storage medium stored with a program that causes a computer to execute the method of the fourth aspect.

The present aspect operates similarly to that of the signal amplifier of the first aspect, so similar effects can be obtained.

A seventh aspect of the present invention is a non-transitory computer readable storage medium stored with a program that causes a computer to execute the method of the fifth aspect.

The present aspect operates similarly to that of the bridge connection signal amplifier of the second aspect, so similar effects can be obtained.

As explained above, latch-up of the switching elements can be prevented according to each aspect of the present invention.

BRIEF DESCRIPTION OF THE DRAWINGS

Exemplary embodiments of the present invention will be described in detail based on the following figures, wherein:

FIG. 4A to FIG. 4C are graphs showing examples of change with time in voltage values and current values during normal power down, in which

DETAILED DESCRIPTION

Detailed explanation follows regarding an exemplary embodiment with reference to the drawings. The following is an explanation of a case in which the present invention has been applied to an amplifier used in connection to a speaker. Aspects of the configuration of the amplifier according to the present exemplary embodiment that are similar to the amplifier 100 shown in FIG. 5 are allocated the same reference numerals and further explanation thereof is omitted. In the following description, a minus surge current is referred to as a "minus surge" and a plus surge current is referred to as a "plus surge"; however, reference is made to a "surge current" when there is no need to discriminate therebetween. Further, a gate voltage for changing a non-conducting state between the source terminal and the drain terminal of an MOS transistor to a conducing state (corresponding to an ON state of the MOS transistor functioning as a switching element) is referred to as an "ON voltage".

First Exemplary Embodiment

Figure 1:
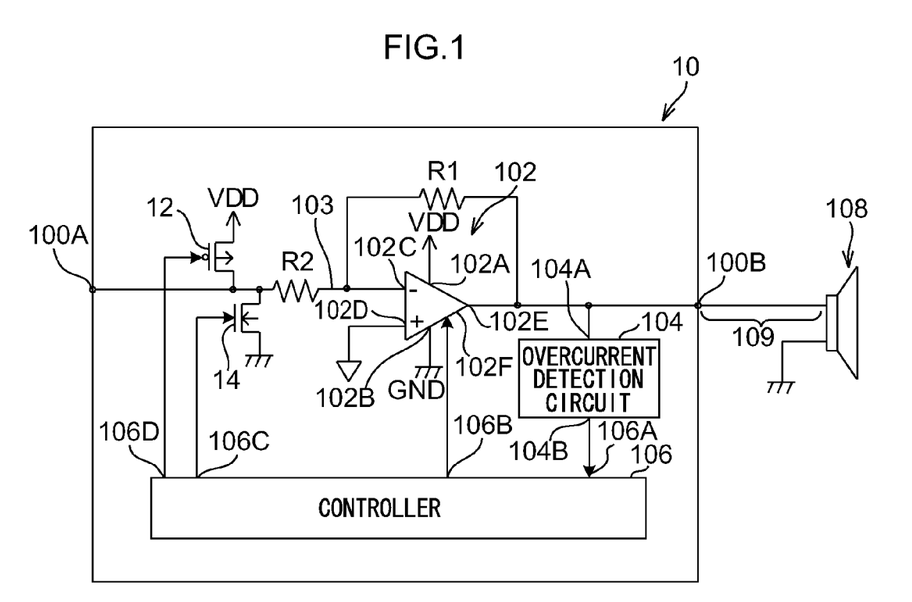
FIG. 1 is a diagram showing an example of a configuration of an amplifier according to a first exemplary embodiment.

FIG. 1 is a diagram illustrating an example of a configuration of an amplifier 10 according to a first exemplary embodiment. As shown in FIG. 1, the amplifier 10 only differs from the amplifier 100 shown in FIG. 5 in that it is provided with a PMOS transistor 12 serving as a first switching element and an NMOS transistor 14 serving as a second switching element, and output terminals 106C, 106D are provided at the controller 106 that serves as a control section.

The PMOS transistor 12 is equipped with a source terminal connected to a power supply line VDD, a drain terminal connected to the signal line 103 between the input terminal 100A and the resistance element R2, and a gate terminal connected to the output terminal 106D of the controller 106.

The NMOS transistor 14 is equipped with a source terminal connected to the ground line GND, a drain terminal connected to the signal line 103 between the input terminal 100A and the resistance element R2, and a gate terminal connected to the output terminal 106C of the controller 106.

Explanation follows regarding operation of the amplifier 10 according to the first exemplary embodiment. First, explanation follows regarding a case in which audio is output from the speaker 108 through the amplifier 10. In order to avoid confusion, the explanation is made of a case in which the amplifier 10 is set in an initial state and an analogue audio signal expressing audio to be output from the speaker 108 is output from an external device (not shown in the drawings) to the input terminal 100A of the amplifier 10. In the present exemplary embodiment, the "initial state" indicates that in the inverting amplification circuit 102, the respective drain terminals and source terminals of the PMOS transistor 118 and the NMOS transistor 122 are in a non-conducting state (the PMOS transistor 118 and the NMOS transistor 122, which function as switching elements, are both in an OFF state), and the respective drain terminals and source terminals of the PMOS transistor 116 and the NMOS transistor 120 are in a conducting state (the PMOS transistor 116 and the NMOS transistor 120, which function as switching elements, are both in an ON state).

When the differential stage 110 is input with an audio signal expressing audio to be output from the speaker 108, the differential stage 110 generates a differential voltage signal between the positive input signal and negative input signal of the input audio signal, amplifies the generated differential voltage signal and outputs the positive differential signal through the off-set stage 112 to the gate terminal of the PMOS transistor 116, and the negative differential signal to the NMOS transistor 120.

The PMOS transistor 116 and the NMOS transistor 120 are either put in a conducting state or a non-conducting state according to the voltage arising from the differential signal input from the off-set stage 112, and corresponding current is output from the output terminal 102E. When the speaker 108 is connected to the output terminal 102E, the audio signal resulting from the current output from the output terminal 102E, which has been reproduced in the original analogue signal format, is output from the speaker 108.

Conventionally, when an overcurrent is detected by the overcurrent detection circuit 104 in the amplifier 10, the inverting amplification circuit 102 is powered down. "Powered down" means here that the output from the amplifier is halted, and specifically means that driving of the switching elements to be protected is halted.

By powering down the inverting amplification circuit 102, the PMOS transistor 116 and the NMOS transistor 120 can be prevented from being damaged by overcurrent.

Figure 4A:
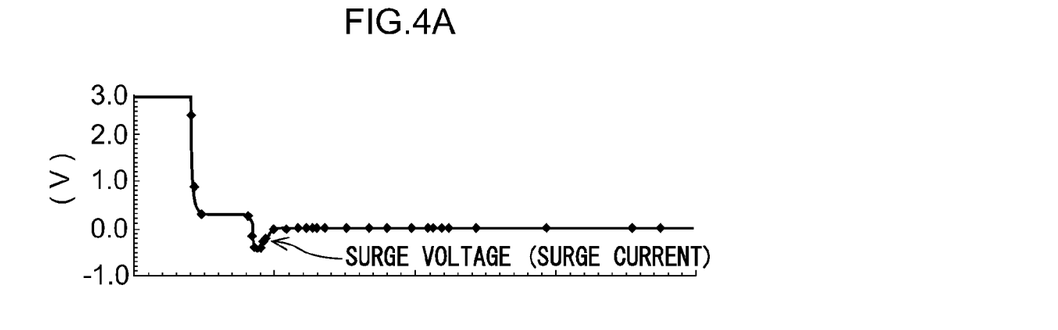
FIG. 4A shows change with time in the voltage value of an output terminal of an inverting amplification circuit.
Figure 4B:
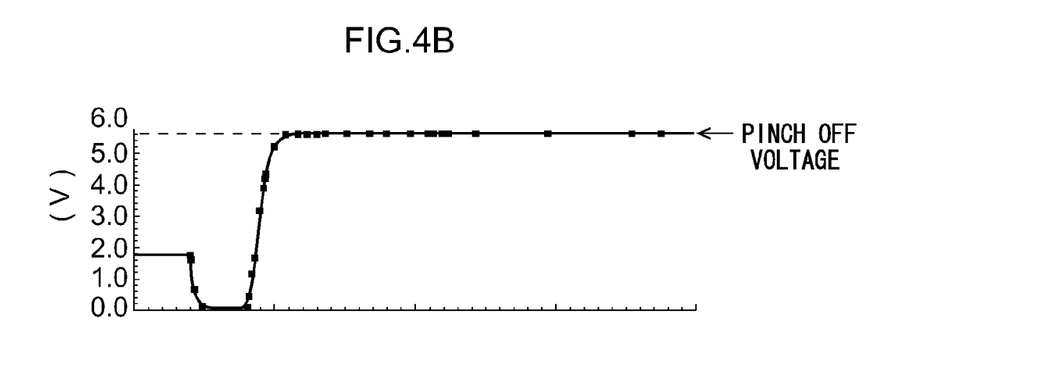
FIG. 4B shows change with time in the voltage value applied to the gate terminal of a PMOS transistor to be protected.
Figure 4C:
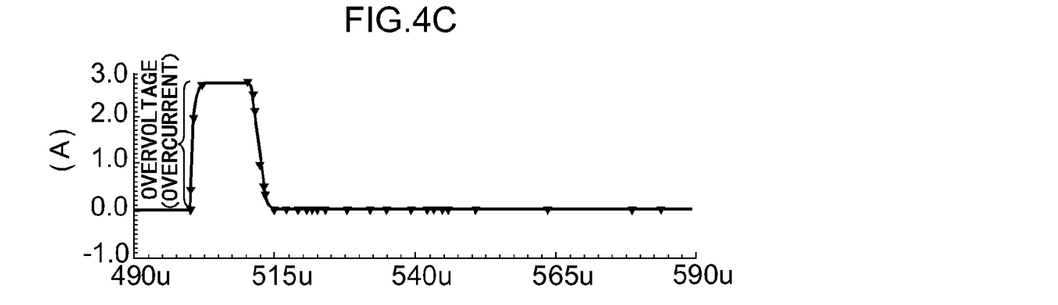
FIG. 4C shows change with time in current values of an overcurrent detected by an overcurrent detection circuit.

However, in order to perform powering down, the controller 106 controls the magnitude of the voltage applied to each of the gate terminals of the PMOS transistor 116 and the NMOS transistor 120 such that the conducting state between the respective source terminals and drain terminals of the PMOS transistor 116 and the NMOS transistor 120 changes to a non-conducting state. However, at this time, since an OFF voltage is rapidly applied to the gate terminals of the PMOS transistor 116 and the NMOS transistor 120 (see, for example, FIG. 4B showing an example of changes in the magnitude of voltage applied to the gate terminal of the PMOS transistor 116 over time), the conducting state between the respective source terminals and drain terminals of the PMOS transistor 116 and the NMOS transistor 120 rapidly changes to a non-conducting state. At the output terminal 102E a sudden change occurs from a state in which overcurrent is flowing to one in which current is not flowing (see, for example, FIG. 4C). A surge current is accordingly generated at the output terminal 102E, and due to the generated surge current the magnitude of the output voltage of the inverting amplification circuit 102 may temporarily fall below the magnitude of the ground voltage, as shown in the example in FIG. 4A. This results in latch-up occurring at the PMOS transistor 116 and the NMOS transistor 120, which damages the PMOS transistor 116 and the NMOS transistor 120.

The latch-up is induced by a minus surge occurring when overcurrent is stopped when output from the output terminal 102E is ground shorted, or is induced by a plus surge occurring when overcurrent is stopped when output from the output terminal 102E is power supply shorted. The inductance values conceivably present when latch-up occurs have been found in tests by the inventors to be about 350 nH when the overcurrent is 3 A. Accordingly, countermeasures to prevent latch-up need to be taken when a cable 109, or inductance section corresponding to the cable 109, having an inductance component of about 350 nH is connected to the output terminal 102E.

Accordingly, the amplifier 10 of the first exemplary embodiment performs power down processing that powers down the inverting amplification circuit 102 without inducing latch-up.

Figure 2:
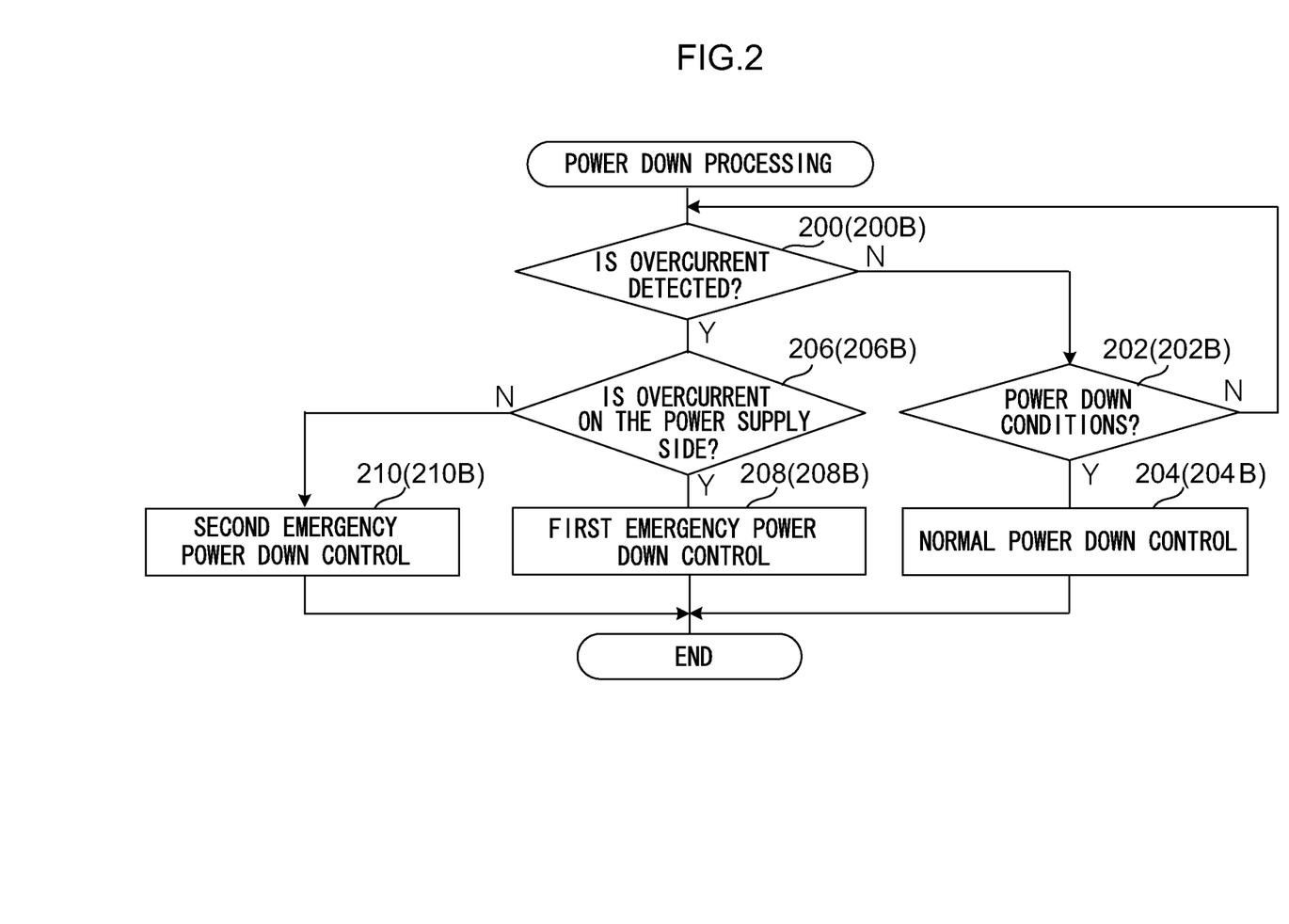
FIG. 2 is a flow chart showing the processing of a power down program according to the first exemplary embodiment and a second exemplary embodiment.

Explanation follows regarding operation of the amplifier 10 performing power down processing, with reference to FIG. 2. FIG. 2 is a flow chart illustrating a flow of a power down program executed by the controller 106 when power is introduced to the amplifier 10.

At step 200 in FIG. 2, determination is made as to whether or not overcurrent has been detected by the overcurrent detection circuit 104, and if it is determined that no overcurrent has been detected, the processing proceeds to step 202. At step 202, determination is made as to whether or not a condition is satisfied for transitioning the inverting amplification circuit 102 to a power down state (for example a condition such as: the controller 106 has received an instruction to interrupt power supply to the amplifier 10, or a specific period of time has elapsed from when power was introduced to the amplifier 10). Processing returns to step 200 if it is determined that the condition is not satisfied. However, processing proceeds to step 204 if it is determined that the condition is satisfied and the power down program is ended after performing normal power down control which is a power down process for a normal operation. Specifically, at step 204, a corresponding ON voltage is applied to the respective gate terminals of the PMOS transistor 118 and the NMOS transistor 122 such that the PMOS transistor 118 and the NMOS transistor 122 that are respectively in non-conducting states are turned on to conducting states.

The power supply voltage is applied to the gate terminal of the PMOS transistor 116 due to the PMOS transistor 118 being turned on to a conducting state by the processing of step 204. Accordingly, the PMOS transistor 116 is turned off to a non-conducting state (the gate terminal of the PMOS transistor 116 is pulled up). The gate terminal of the NMOS transistor 120 is also applied with the ground voltage due to the NMOS transistor 122 being turned on to a conducting state by the processing of step 204. The NMOS transistor 120 is accordingly turned off to a non-conducting state (the gate terminal of the NMOS transistor 120 is pulled down).

If the determination at step 200 is positive, processing proceeds to step 206, and a determination is then made as to whether or not overcurrent detected by the processing of step 200 is overcurrent that flowed in the power supply line VDD. If the determination is affirmative, the processing proceeds to step 208. However, if it is determined that the overcurrent did not flow in the power supply line VDD, namely, that the overcurrent flowed in the ground line GND, the determination is negative and the processing proceeds to step 210.

At step 208, first emergency power down control is performed. Namely, the above-described normal power down control is performed at a time when a predetermined duration has elapsed after effecting control such that the PMOS transistor 12 is turned on to a conducting state and the NMOS transistor 14 is turned off to a non-conducting state. More specifically, at a time when the predetermined duration has elapsed since the OFF voltage was applied to the gate terminal of the PMOS transistor 12, a corresponding ON voltage is applied to the respective gate terminals of the PMOS transistor 118 and the NMOS transistor 122 so that the PMOS transistor 118 and the NMOS transistor 122, which have been in a non-conducting state, are switched to a conducting state. The magnitude of the voltage applied to the output terminal 102E in the inverting amplification circuit 102 at that time is accordingly pulled down to the magnitude of the ground voltage without turning off the PMOS transistor 116 and the NMOS transistor 120 to a non-conducting state, and then the PMOS transistor 116 and the NMOS transistor 120 are turned off to the non-conducting state. Consequently, generation of a minus surge is suppressed and latch-up of the PMOS transistor 116 and the NMOS transistor 120 can be prevented from occurring.

At step 210, a second emergency power down control is performed. Namely, the above-described normal power down control is performed at a time when a predetermined duration has elapsed since effecting control such that the PMOS transistor 12 is turned off to a non-conducting state and the NMOS transistor 14 is turned on to a conducting state. More specifically, at a time when the predetermined duration has elapsed since the OFF voltage was applied to the gate terminal of the NMOS transistor 14, a corresponding ON voltage is applied to the respective gate terminals of the PMOS transistor 118 and the NMOS transistor 122 so that the PMOS transistor 118 and the NMOS transistor 122, which have been in a non-conducting state, are switched to a conducting state. The magnitude of the voltage applied at the output terminal 102E in the inverting amplification circuit 102 at that time is accordingly pulled up to the magnitude of the power supply voltage without turning off the PMOS transistor 116 and the NMOS transistor 120 to a non-conducting state, and then the PMOS transistor 116 and the NMOS transistor 120 are turned off to the non-conducting state. Consequently, generation of a plus surge is suppressed and latch-up of the PMOS transistor 116 and the NMOS transistor 120 can be prevented from occurring.

The "predetermined duration" employed in step 208 and step 210 refers to a duration estimated in advance as the duration required for the magnitude (voltage value) of the voltage at the output terminal 102E to recover to the voltage value during normal operation. Voltage values obtained in advance by experimentation and/or computer simulation may be employed for these predetermined durations. Specifically, the duration required for the voltage value at the output terminal 102E to return to the ground voltage value is employed as the "predetermined duration" used in step 208, and the duration required for the voltage value at the 102E to return to the power supply voltage is employed as the "predetermined duration" used in step 210.

As explained in detail above, in the amplifier 10 according to the first exemplary embodiment, in a case in which overcurrent has flowed in the power supply line VDD, the inverting amplification circuit 102 is powered down after turning on the PMOS transistor 12 to a conducting state and turning off the NMOS transistor 14 to a non-conducting state. In a case in which the overcurrent has flowed in the ground line GND, the inverting amplification circuit 102 is powered down after turning off the PMOS transistor 12 to a non-conducting state and turning on the NMOS transistor 14 to a conducting state. Consequently, latch-up of the PMOS transistor 116 and the NMOS transistor 120 can be prevented.

Second Exemplary Embodiment

Figure 3:
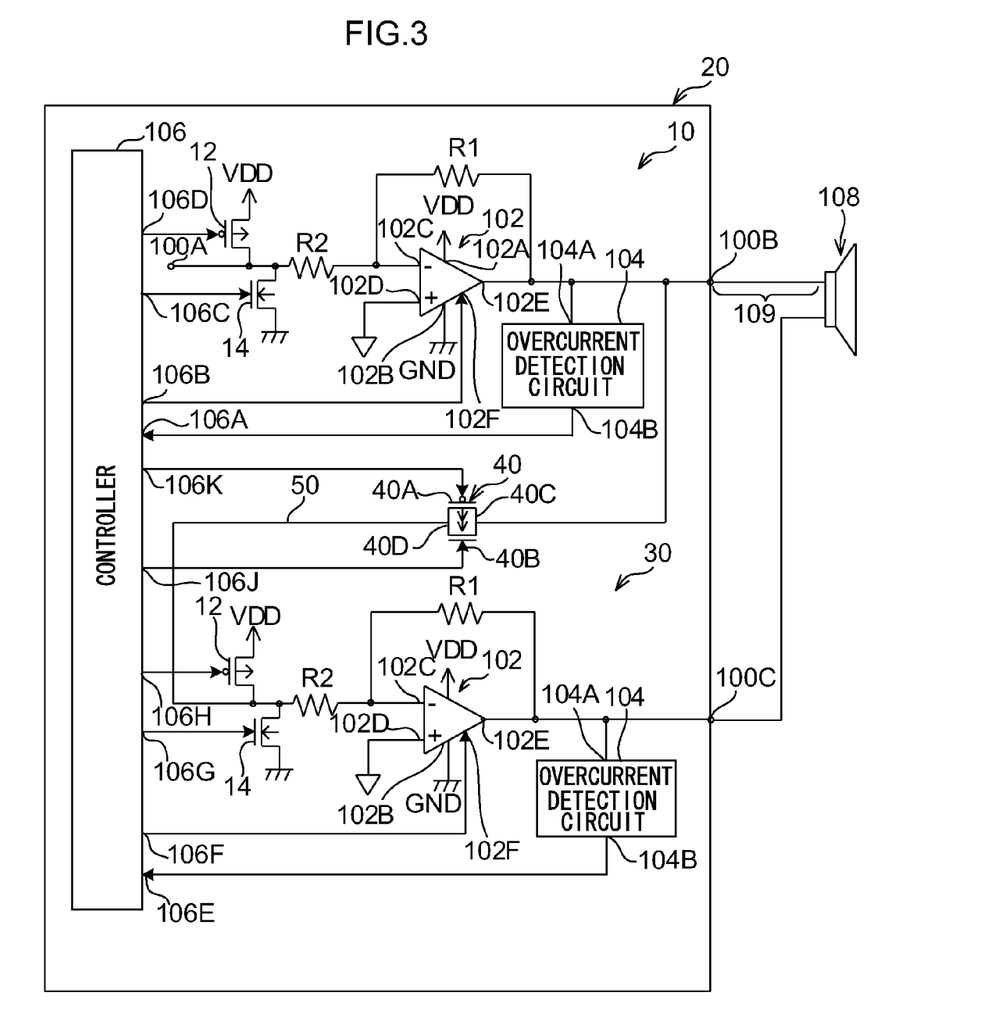
FIG. 3 is a diagram showing an example of a configuration of an amplifier according to the second exemplary embodiment.

FIG. 3 is a diagram showing an example of a configuration of an amplifier 20 according to a second exemplary embodiment. The amplifier 20 according to the second exemplary embodiment is a BTL amplifier used for a Bridged Transless (BTL) connection. Since the amplifier 20 differs from the amplifier 10 shown in FIG. 1 only in that an amplifier 30 and a switch 40 serving as a third switching element are further provided therein, only points of the second exemplary embodiment differing from the first exemplary embodiment are described in the following. Similar parts in the configuration of the second exemplary embodiment to that of the first exemplary embodiment are allocated the same reference numerals and further explanation thereof is omitted.

The amplifier 30 has fundamentally the same components as the amplifier 10 according to the first exemplary embodiment, but differs from the amplifier 10 in that: the input terminal 100A is omitted; an output terminal 100C is provided and connected to the negative input terminal of the speaker 108 instead of the output terminal 100B; the gate terminal of the PMOS transistor 12 is connected to an output terminal 106H of the controller 106 instead of the output terminal 106D; the gate terminal of the NMOS transistor 14 is connected to an output terminal 106G of the controller 106 instead of the output terminal 106C; the control terminal 102F of the inverting amplification circuit 102 is connected to an output terminal 106F of the controller 106 instead of the output terminal 106B; and the output terminal 104B of the overcurrent detection circuit 104 is connected to an input terminal 106E of the controller 106 instead of the input terminal 106A.

The switch 40 is a 3 input-1 output switching element which is in a conducting state during normal operation. The switch 40 is equipped with a PMOS transistor and an NMOS transistor, with a gate terminal 40A of the PMOS transistor serving as a first input terminal (referred to below as the PMOS gate terminal) connected to an output terminal 106K of the controller 106, and with a gate terminal 40B of the NMOS transistor serving as a second input terminal (referred to below as the NMOS gate terminal) connected to an output terminal 106J of the controller 106. A third input terminal 40C is connected to the output terminal 102E of the amplifier 10, and an output terminal 40D is connected by an output line 50 to the inverting input terminal 102C of the amplifier 30 through the resistance element R2 of the amplifier 30. Namely, the output terminal 102E of the amplifier 10 is connected to the inverting input terminal 102C of the amplifier 30 through the switch 40 and the resistance element R2 using the output line 50.

Explanation follows regarding operation of the amplifier 20 when performing power down processing according to the second exemplary embodiment, with reference to FIG. 2. FIG. 2 is a flow chart showing the flow of a power down program according to the second exemplary embodiment executed by the controller 106 when power is introduced to the amplifier 20.

At step 200B in FIG. 2, determination is made as to whether or not overcurrent has been detected by the overcurrent detection circuit 104 of the amplifier 10 and/or the overcurrent detection circuit 104 of the amplifier 30, and if it is determined that no overcurrent has been detected, the processing proceeds to step 202B. At step 202B, determination is made as to whether or not a condition is satisfied for transitioning the respective inverting amplification circuits 102 of the amplifier 10 and the amplifier 30 to a power down state (for example a condition such as: the controller 106 has received an instruction to interrupt power supply to the amplifier 20, or a specific period of time has elapsed from when power was introduced to the amplifier 20). If it is determined that the condition is not satisfied, the processing returns to step 200B. However, the processing proceeds to step 204B if it is determined that the condition is satisfied, and the power down program is ended after performing normal power down control which is a power down process in normal operation. Specifically at step 204B, while the switch 40 remains in a conducting state, in each of the amplifier 10 and the amplifier 30, a corresponding ON voltage is applied to the respective gate terminals of the PMOS transistors 118 and the NMOS transistors 122 such that the PMOS transistors 118 and the NMOS transistors 122 respectively in non-conducting states are turned on to conducting states.

The power supply voltage is applied to the gate terminals of the PMOS transistors 116 of the amplifier 10 and the amplifier 30 due to the PMOS transistors 118 of the amplifier 10 and the amplifier 30 being put in a conducting state by the processing of step 204B. Accordingly, the PMOS transistors 116 of the amplifier 10 and the amplifier 30 are each turned off to a non-conducting state (the gate terminals of the PMOS transistors 116 are pulled up). The gate terminals of the NMOS transistors 120 of the amplifier 10 and the amplifier 30 are also applied with the ground voltage due to the NMOS transistors 122 of the amplifier 10 and the amplifier 30 being put in a conducting state by the processing of step 204B. The NMOS transistors 120 of the amplifier 10 and the amplifier 30 are accordingly turned off to a non-conducting state (the gate terminals of the NMOS transistor 120 are pulled down).

If the determination at step 200B is positive, the processing proceeds to step 206B and determination is then made as to whether or not overcurrent detected by the processing of step 200B is overcurrent that flowed in the power supply line VDD. If the determination is affirmative, the processing proceeds to step 208B. However, if it is determined that the overcurrent did not flow in the power supply line VDD, namely that the overcurrent flowed in the ground line GND, the determination is negative and the processing proceeds to step 210B.

At step 208B, first emergency power down control is performed. Namely, the above-described normal power down control is performed at a time when a predetermined duration (this being a similar duration to the predetermined duration explained in the first exemplary embodiment) has elapsed since turning off the switch 40 from a conducting state to a non-conducting state, and in the amplifier 10 and the amplifier 30, turning on the PMOS transistors 12 to a conducting state and turning off the NMOS transistors 14 to a non-conducting state. More specifically, at a time when a predetermined duration has elapsed since a voltage was applied to the PMOS gate terminal 40A and the NMOS gate terminal 40B such that the switch 40 is turned off from a conducting state to a non-conducting state, and since the OFF voltage was applied to the gate terminals of the PMOS transistors 12 in the amplifier 10 and the amplifier 30, a corresponding ON voltage is applied to the respective gate terminals of the PMOS transistors 118 and the NMOS transistors 122 so that the PMOS transistors 118 and the NMOS transistors 122 which had been in a non-conducting state are turned on to a conducting state. The magnitude of the voltage applied to the output terminals 102E in the inverting amplification circuits 102 at that point in time in the amplifier 10 and the amplifier 30 is accordingly pulled down to the magnitude of the ground voltage without turning off the PMOS transistors 116 and the NMOS transistors 120 to a non-conducting state, and then the PMOS transistors 116 and the NMOS transistors 120 are turned off to a non-conducting state. Consequently, generation of a minus surge is suppressed and latch-up of the PMOS transistors 116 and the NMOS transistors 120 can be prevented from occurring.

At step 210B, a second emergency power down control is performed. Namely, the above-described normal power down control is performed at a time when a predetermined duration (a duration similar to the predetermined duration explained in the first exemplary embodiment) has elapsed since turning off the switch 40 from a conducting state to a non-conducting state and, in the amplifier 10 and the amplifier 30, turning off the PMOS transistors 12 to a non-conducting state and turning on the NMOS transistors 14 to a conducting state. More specifically, at a time when a predetermined duration has elapsed since the voltage was applied to the PMOS transistor gate terminal 40A and the NMOS transistor 40B such that the switch 40 is turned off from a conducting state to a non-conducting state and since the OFF voltage was applied to the gate terminals of the NMOS transistors 14 in the amplifier 10 and the amplifier 30, a corresponding ON voltage is applied to the respective gate terminals of the PMOS transistors 118 and the NMOS transistors 122 so that the PMOS transistor 118 and the NMOS transistor 122 are turned on from non-conducting states to conducting states. The magnitude of the voltage applied to the output terminals 102E in the inverting amplification circuits 102 in the amplifier 10 and the amplifier 30 at that point in time is accordingly pulled up to the magnitude of the power supply voltage without turning off the PMOS transistors 116 and the NMOS transistors 120 to a non-conducting state, and then the PMOS transistors 116 and the NMOS transistors 120 are turned off to a non-conducting state. Consequently, generation of a plus surge is suppressed and latch-up of the PMOS transistors 116 and the NMOS transistors 120 can be prevented from occurring.

As explained in detail above, in the amplifier 20 according to the second exemplary embodiment, in a case in which overcurrent has flowed in the power supply line VDD, the PMOS transistors 116 and the NMOS transistors 120 are turned off to a non-conducting state after turning off the switch 40 to a non-conducting state, and after turning on the PMOS transistors 12 to a conducting state and turning off the NMOS transistors 14 to a non-conducting state in each of a pair of amplifiers (in this case the amplifier 10 and the amplifier 30). In a case in which overcurrent has flowed in the ground line GND, the PMOS transistors 116 and the NMOS transistors 120 are turned off to a non-conducting state after turning off the switch 40 to a non-conducting state, and after turning off the PMOS transistors 12 to a non-conducting state and turning on the NMOS transistors 14 to a conducting state in each of the pair of amplifiers. Consequently, latch-up of the PMOS transistors 116 and the NMOS transistors 120 can be prevented in each of the pair of amplifiers.

In the above exemplary embodiment, an example has been described in which the cable 109 connected to the output terminal 100B has a parasitic inductance component of 500 nH. However, embodiments are not limited thereto. For example, the cable 109 may be replaced with a semiconductor device or coil having a parasitic inductance component equivalent to that of the cable 109, or with any inductance section having an inductance component which may induce latch-up of a switching element included in the inverting amplification circuit 102 due to surge current arising as a result of an electromagnetic induction effect caused by instantly interrupting overcurrent flowing in the inverting amplification circuit 102.

While explanation has been given in the above exemplary embodiments of cases in which power down processing is realized by a software configuration executing a power down program, embodiments are not limited thereto, and the power down processing may be realized by means of hardware configuration. Obviously, the power down processing may also be realized by means of a combination of hardware configuration and software configuration.

Further, in the above exemplary embodiments, fixed resistance elements are employed as the resistance elements R1, R2; however, embodiments are not limited thereto, and semi-fixed resistance elements or variable resistance elements may be employed.

In the above exemplary embodiments, explanation has been given of examples in which the present invention is applied to an amplifier connected to a speaker. However, embodiments are not limited thereto. The present invention can be applied to a regulator circuit, or to any circuit having a switching element to be protected from latch-up caused by the occurrence of a surge current.

In the above exemplary embodiments, the controller 106 switches the PMOS transistor 12, the NMOS transistor 14 and the switch 40 between conducting states and non-conducting states (on/off) when flow of overcurrent has occurred based on an input of an overcurrent detection signal from the overcurrent detection circuit 104. However, embodiments are not limited thereto. A configuration may be adopted such that a user monitors the detection result of the overcurrent detection circuit 104, and when occurrence of an overcurrent is ascertained, manually switches the PMOS transistor 12, the NMOS transistor 14 and the switch 40 between conducting states and non-conducting states either through a controller 106 or through another switching circuit.

Further, in the above exemplary embodiments, explanation has been given of examples in which field effect transistors are employed as switching elements. However, embodiments are not limited thereto and bipolar transistors may be alternatively employed. In such cases, a bipolar transistor may substitute for an MOS transistor, with the collector terminal of the bipolar transistor corresponding to the drain terminal of the MOS transistor, the emitter terminal of the bipolar transistor corresponding to the source terminal of the MOS transistor, and the base terminal of the bipolar transistor corresponding to the gate terminal of the MOS transistor.

In the above exemplary embodiments, the power down program is pre-stored on a ROM; however, embodiments are not limited thereto. The power down program may be supplied in a form stored on any computer readable storage medium, such as a CD-ROM, DVD-ROM or Universal Serial Bus (USB) memory, or may be distributed through a wired or wireless communication system.

What is claimed is:

1. A signal amplifier comprising:
an inverting amplification circuit comprising a first voltage terminal connected to a first voltage line that is applied with a first voltage, a second voltage terminal connected to a second voltage line that is applied with a second voltage that is different from the first voltage, an inverting input terminal connected to a signal line into which a signal is input, an output terminal connected via a resistance element to the inverting input terminal and connected to a section having an inductive component, a first protected switching element disposed between the first voltage line and the output terminal, which switches a conducting state between the first voltage line and the output terminal during normal operation to a non-conducting state, and a second protected switching element disposed between the second voltage line and the output terminal, which switches a conducting state between the second voltage line and the output terminal during normal operation to a non-conducting state;
a first conducting switching element comprising a first terminal connected to the first voltage line, a second terminal connected to the signal line, and a first control terminal, the first conducting switching element switching a non-conducting state between the first terminal and the second terminal during normal operation to a conducting state when an ON voltage is applied to the first control terminal;
a second conducting switching element comprising a third terminal connected to the second voltage line, a fourth terminal connected to the signal line, and a second control terminal, the second conducting switching element switching a non-conducting state between the third terminal and the fourth terminal during normal operation to a conducting state when an ON voltage is applied to the second control terminal; and a control section that effects control such that when an overcurrent flows in the first voltage line, the first protected switching element and the second protected switching element are switched to a non-conducting state after switching the first conducting switching element to a conducting state and switching the second conducting switching element to a non-conducting state, and effects control such that when an overcurrent flows in the second voltage line, the first protected switching element and the second protected switching element are switched to a non-conducting state after switching the first conducting switching element to a non-conducting state and switching the second conducting switching element to a conducting state.

2. The signal amplifier of claim 1, wherein:
the control section effects control such that when an overcurrent flows in the first voltage line, the first protected switching element and the second protected switching element are switched to a non-conducting state at a time estimated in advance as a time for the output terminal to return to its normal operation voltage value after switching the first conducting switching element to the conducting state and switching the second switching element to the non-conducting state, and effects control such that when an overcurrent flows in the second voltage line, the first protected switching element and the second protected switching element are switched to the non-conducting state at the time estimated in advance after switching the first conducting switching element to the non-conducting state and switching the second conducting switching element to the conducting state.

3. A bridge connection signal amplifier comprising:
a pair of the signal amplifiers of claim 1;
an output line connected to the output terminal of the inverting amplification circuit of a first signal amplifier of the pair of signal amplifiers, and connected to the inverting input terminal of the inverting amplification circuit of a second signal amplifier of the pair of signal amplifiers as the signal line connected to the inverting amplification circuit; and
a third switching element that is provided on the output line and is in a conducting state during normal operation, the third switching element being capable of switching a conducting state between the output terminal of the first signal amplifier and the inverting input terminal of the second signal amplifier to a non-conducting state, wherein,
the control sections effect control such that when an overcurrent flows in the first voltage lines, the first protected switching elements and the second protected switching elements are switched to a non-conducting state after switching the third switching element to a non-conducting state and after switching the first conducting switching elements to a conducting state and switching the second conducting switching elements to a non-conducting state in each of the pair of signal amplifiers, and effect control such that when an overcurrent flows in the second voltage lines, the first protected switching elements and the second protected switching elements are switched to a non-conducting state after switching the third switching element to a non-conducting state and after switching the first conducting switching element to a non-conducting state and switching the second conducting switching element to a conducting state in each of the pair of signal amplifiers.

4. A signal output device comprising:
the bridge connection signal amplifier of claim 3; and
a signal output section that outputs an amplified signal, obtained by amplifying the signal input to the signal line using the inverting amplification circuit in each of the pair of signal amplifiers, from the output terminals of each of the inverting amplification circuits via the inductance section.

5. A method of preventing latch-up of a signal amplifier comprising the inverting amplification circuit, the first conducting switching element and the second conducting switching element according to claim 1, the latch-up prevention method comprising:
switching the first protected switching element and the second protected switching element to a non-conducting state after switching the first conducting switching element to a conducting state and switching the second conducting switching element to a non-conducting state when an overcurrent flows in the first voltage line, and
switching the first protected switching element and the second protected switching element to a non-conducting state after switching the first conducting switching element to a non-conducting state and the second conducting switching element to a conducting state when an overcurrent flows in the second voltage line.

6. A method of preventing latch-up of the bridge connection signal amplifier of claim 3, the latch-up prevention method comprising:
switching the first protected switching element and the second protected switching element to a non-conducting state after switching the third switching element to a non-conducting state, and after switching the first conducting switching element to a conducting state and switching the second conducting switching element to a non-conducting state in each of the pair of signal amplifiers when an overcurrent flows in the first voltage line; and
switching the first protected switching element and the second protected switching element to a non-conducting state after switching the third switching element to a non-conducting state, and after switching the first conducting switching element to a non-conducting state and switching the second conducting switching element to a conducting state in each of the pair of signal amplifiers when an overcurrent flows in the second voltage line.

7. A non-transitory computer readable storage medium storing a program that causes a computer to execute the method of claim 5.

8. A non-transitory computer readable storage medium storing a program that causes a computer to execute the method of claim 6.

* * * * *